US008941995B2

(12) United States Patent
Chiang

(10) Patent No.: US 8,941,995 B2
(45) Date of Patent: Jan. 27, 2015

(54) FIXING BRACKET AND ELECTRONIC DEVICE USING THE SAME

(71) Applicants: Inventec (Pudong) Technology Corporation, Shanghai (CN); Inventec Corporation, Taipei (TW)

(72) Inventor: Tai-Yi Chiang, Taipei (TW)

(73) Assignees: Inventec (Pudong) Technology Corporation, Shanghai (CN); Inventec Corporation, Taipei (TW)

( * ) Notice: Subject to any disclaimer, the term of this patent is extended or adjusted under 35 U.S.C. 154(b) by 164 days.

(21) Appl. No.: 13/777,441

(22) Filed: Feb. 26, 2013

(65) Prior Publication Data

US 2014/0140009 A1    May 22, 2014

(30) Foreign Application Priority Data

Nov. 20, 2012  (CN) .......................... 2012 1 0472396

(51) Int. Cl.
*H05K 7/20* (2006.01)
*H01L 23/40* (2006.01)
*G06F 1/16* (2006.01)

(52) U.S. Cl.
CPC .......... *H01L 23/4093* (2013.01); *G06F 1/1601* (2013.01)
USPC ............ 361/709; 361/707; 361/702; 361/711

(58) Field of Classification Search
USPC .................................. 361/709, 707, 702, 711
See application file for complete search history.

(56) References Cited

U.S. PATENT DOCUMENTS

2008/0013280 A1*  1/2008  Horng et al. .................. 361/704
2010/0038057 A1*  2/2010  Li et al. ........................ 165/80.3

* cited by examiner

*Primary Examiner* — Andargie M Aychillhum
(74) *Attorney, Agent, or Firm* — Huffman Law Group, PC

(57) ABSTRACT

A fixing bracket includes a bracket body, at least one connecting rod assembly, and at least one elastic buckling arm. One side of the bracket body has a first pivoting point and a second pivoting point. The at least one connecting rod assembly includes a first rod, a second rod, a third rod. The first rod has a third pivoting point and a fourth pivoting point. The second rod has a first limiting part, a fifth pivoting point, and a sixth pivoting point. The third rod has a second limiting part, a seventh pivoting point, and a eighth pivoting point. The at least one elastic buckling arm is located on the first rod. The connecting rod assembly drives the elastic buckling arm to move between a release position and a fastening position. When located at the fastening position, the first limiting part is against the second limiting part.

10 Claims, 7 Drawing Sheets

FIXING BRACKET AND ELECTRONIC DEVICE USING THE SAME

CROSS-REFERENCE TO RELATED APPLICATIONS

This non-provisional application claims priority under 35 U.S.C. §119(a) on Patent Application No(s). 201210472396.0 filed in China, P.R.C. on 20 Nov. 2012, the entire contents of which are hereby incorporated by reference.

BACKGROUND OF THE INVENTION

1. Technical Field of the Invention

The disclosure relates to a fixing bracket and an electronic device using the same, and more particularly to a fixing bracket having a connecting rod and an electronic device using the fixing bracket.

2. Description of the Related Art

In recent years, Internet industry, especially for some large enterprises or Internet sites, has undergone rapid and vigorous growth and expansion. As a result, more and more servers are needed due to this increase growth.

A conventional server employs such electronic devices as a motherboard, a hard disk, a fan module, and a power supply inside a chassis. Further, the motherboard is provided with an operating chip, for example, a central processing unit, and a cooling fin group assembled on the motherboard. The cooling fin group has a thermal contact with the operating chip. Thus, the cooling fin group may dissipate the heat generated by the operating chip.

Usually the cooling fin group is fixed on the motherboard with screws. Nonetheless, this fixing way will result in a longer time for assembling the cooling fin group to the motherboard. For this reason, a fixing bracket is provided for fixing the cooling fin group to the motherboard by means of fastening, so as to improve the assembly time. Specifically, the fixing bracket includes two opposite bracket bodies and a fastener. The fastener has a fastening part and a pivoting part oppositely assembled, and a supporting part located between the fastening part and a pivoting part. The pivoting part is pivotally connected with one of the bracket bodies. The cooling fin group is located between the two bracket bodies. When the fastener is pivoted to a fixed position from a release position, the supporting part presses against the cooling fin group, while the fastening part is fastened to the other bracket body. Thereby, the cooling fin group is fixed on the motherboard.

However, existing fixing bracket has a large amount of structural parts and a large size, leading to a utilization rate decline of motherboard area and an increase of material costs.

SUMMARY OF THE INVENTION

The disclosure provides a fixing bracket and an electronic device using the same, to improve the utilization rate of motherboard area and lower the materials costs of the fixing bracket.

The fixing bracket disclosed in the disclosure includes a bracket body, at least one connecting rod assembly, and at least one elastic buckling arm. One side of the bracket body has a first pivoting point and a second pivoting point. The connecting rod assembly includes a first rod, a second rod, and a third rod. The first rod has a third pivoting point pivotally connected with the second pivoting point and a fourth pivoting point. The second rod has a first limiting part, a fifth pivoting point pivotally connected with the first pivoting point, and a sixth pivoting point. The third rod has a second limiting part, a seventh pivoting point pivotally connected with the sixth pivoting point, and a eighth pivoting point pivotally connected with the fourth pivoting point. The elastic buckling arm is located on the first rod; the connecting rod assembly drives the elastic buckling arm to move between a release position and a fastening position; and when the elastic buckling arm is located at the fastening position, the first limiting part supports the second limiting part.

The electronic device disclosed in the disclosure includes a base plate, a heat source, a radiator, and a fixing bracket. The heat source is located on the base plate; the radiator contacts the heat source; and the fixation is located on the base plate and includes a bracket body, at least one connecting rod assembly and at least one elastic buckling arm. One side of the bracket body has a first pivoting point and a second pivoting point. The connecting rod assembly includes a first rod, a second rod, and a third rod. The first rod has a third pivoting point pivotally connected with the second pivoting point, and a fourth pivoting point. The second rod has a first limiting part, a fifth pivoting point pivotally connected with the first pivoting point, and a sixth pivoting point. The third rod has a second limiting part, a seventh pivoting point pivotally connected with the sixth pivoting point, and a eighth pivoting point pivotally connected with the fourth pivoting point. The elastic buckling arm is located on the first rod; the connecting rod assembly drives the elastic buckling arm to move between a release position keeping a distance away from the radiator and a fastening position supporting the radiator; and when the elastic buckling arm is located at the fastening position, the first limiting part supports the second limiting part.

According to the fixing bracket and the electronic device using the same disclosed in the disclosure, the fixing bracket uses a design of connecting rod structure, which can achieve a state of static equilibrium and thus has a self-locking function when the elastic buckling arm is fastened to the fastening position and then suffers a reaction force. In this way, the quantity of fixing brackets to be used can be reduced, so as to improve the utilization rate of motherboard area and lower the materials costs of the fixing bracket.

BRIEF DESCRIPTION OF THE DRAWINGS

The disclosure will become more fully understood from the detailed description given herein below for illustration only, and thus does not limit the disclosure, wherein.

DETAILED DESCRIPTION

Figure 1:
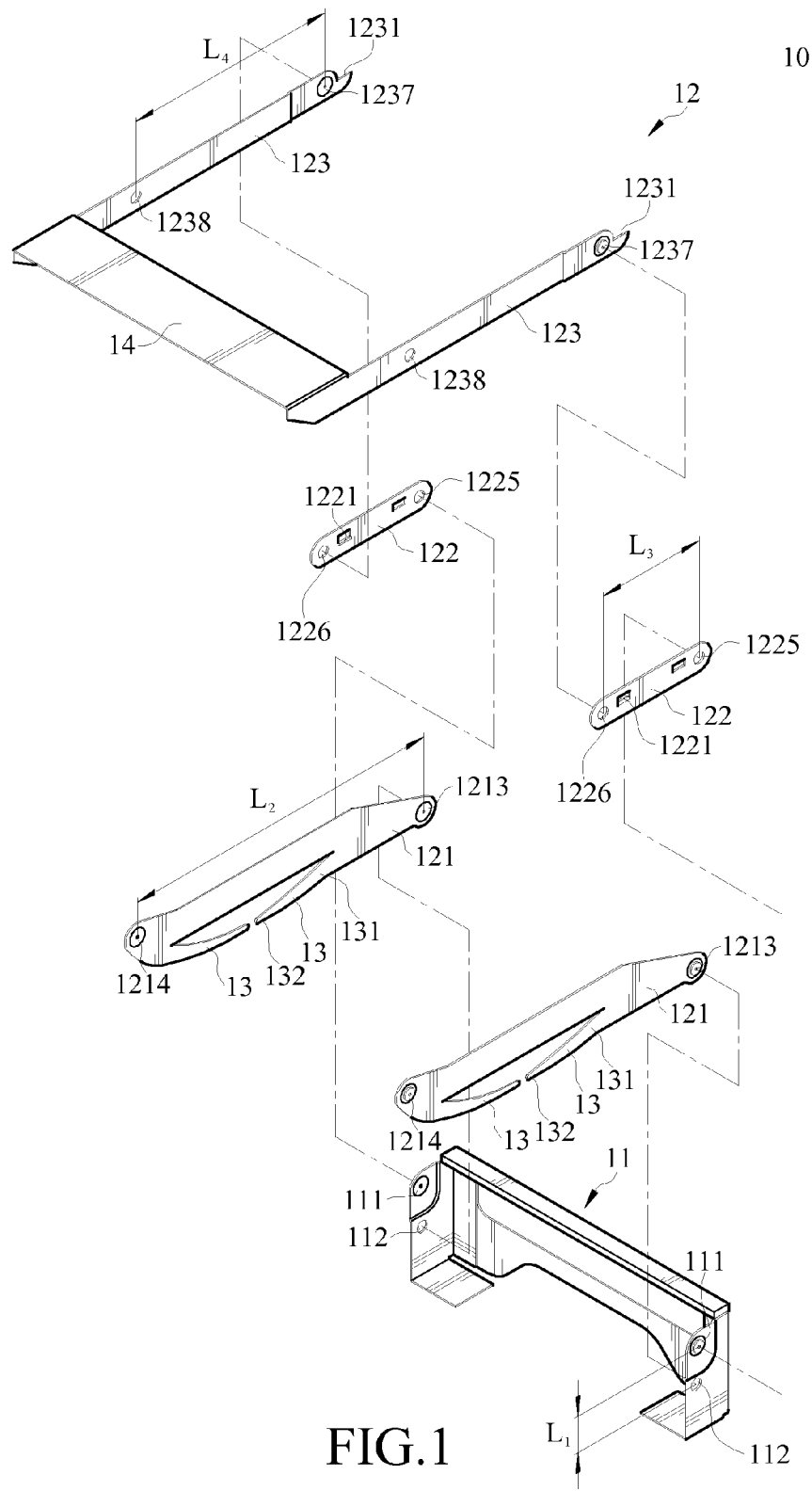
FIG. 1 is an exploded view for the fixing bracket according to one embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2A:
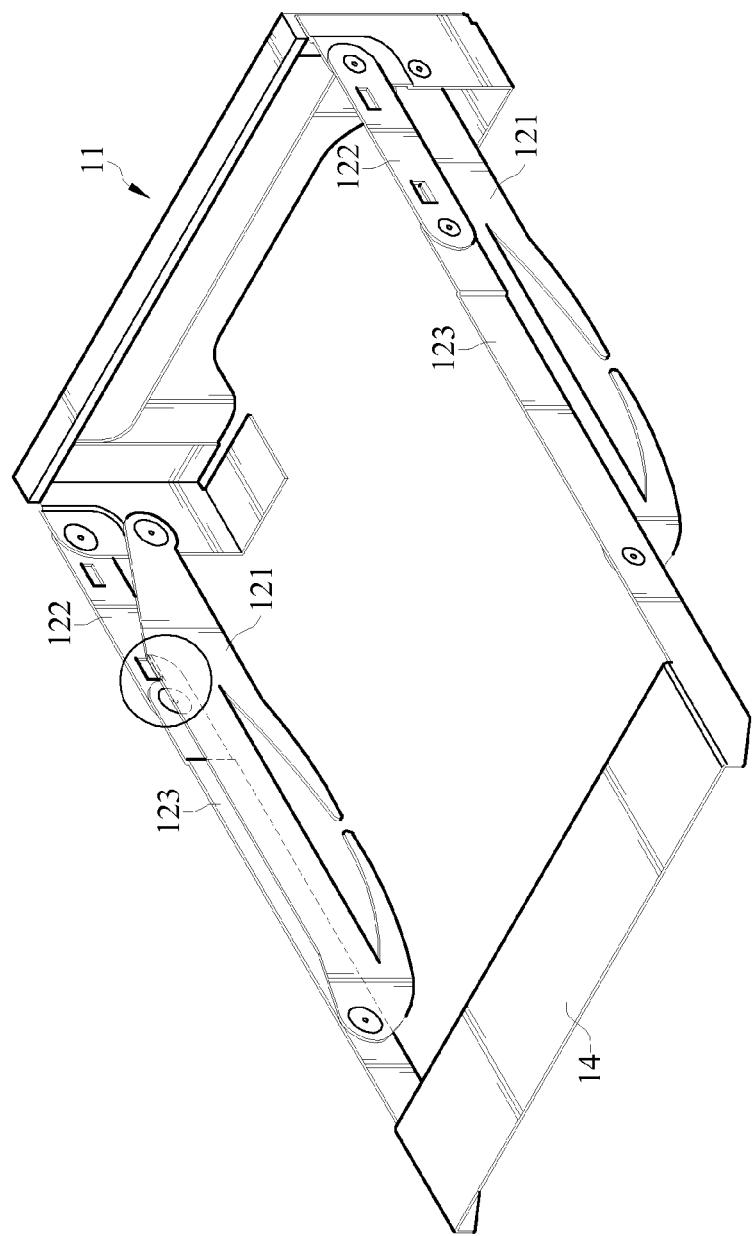
FIG. 2A is a perspective view for the fixing bracket being fastened according to one embodiment of the disclosure.
Figure 2B:
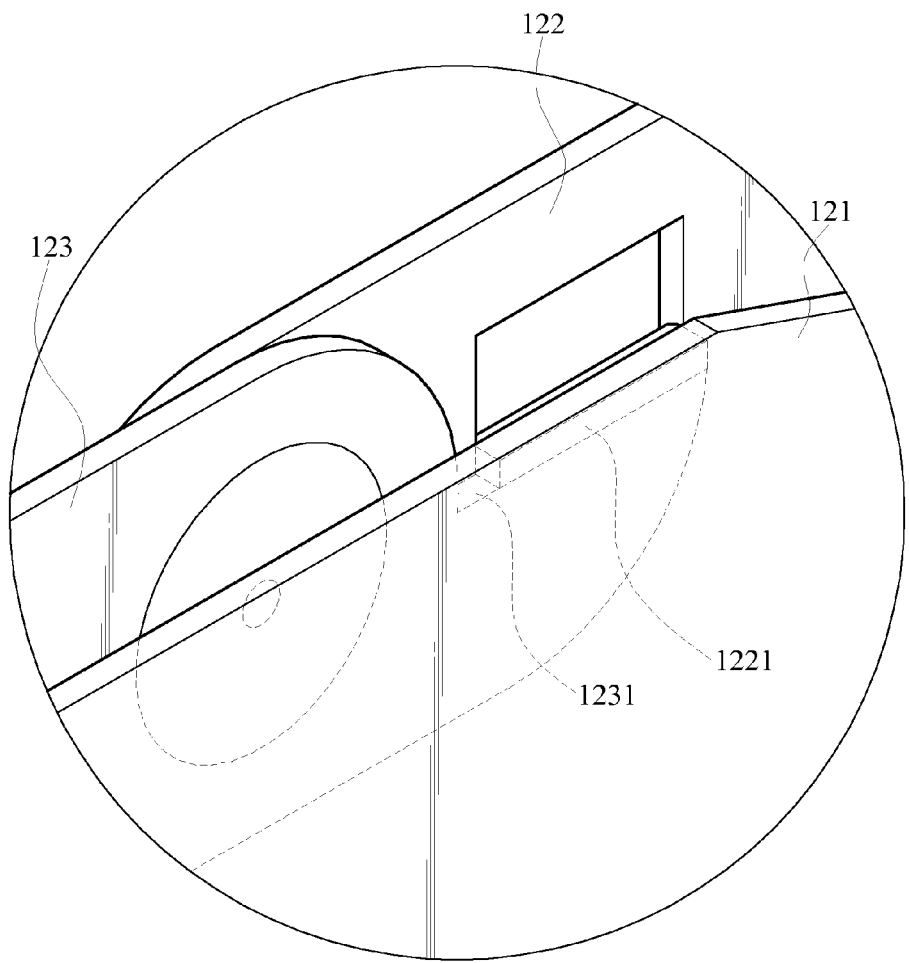
FIG. 2B is a partial enlarged view for the fixing bracket according to one embodiment of the disclosure.
Figure 3:
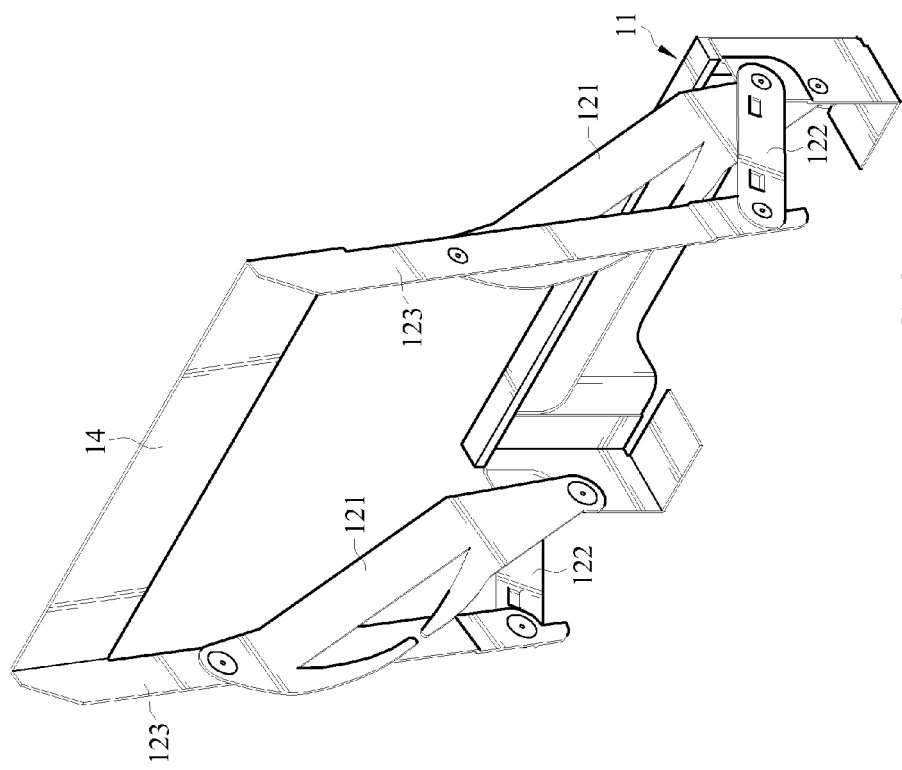
FIG. 3 is a perspective view for the fixing bracket being released according to one embodiment of the disclosure.

Please refer to FIG. 1 to FIG. 3. FIG. 1 is an exploded view for the fixing bracket according to one embodiment of the disclosure. FIG. 2A is a perspective view for the fixing bracket being fastened according to one embodiment of the disclosure. FIG. 2B is a partial enlarged view for the fixing bracket according to one embodiment of the disclosure. FIG. 3 is a perspective view for the fixing bracket being released according to one embodiment of the disclosure.

In this embodiment, the fixing bracket 10 comprises a bracket body 11, two connecting rod assemblies 12, a plurality of elastic buckling arms 13, and a handle 14.

The two opposite sides of the bracket body 11 both have a first pivoting point 111 and a second pivoting point 112. The first pivoting point 111 is above the second pivoting point 112.

The two connecting rod assemblies 12 are pivotally connected with the two opposite sides of the bracket body 11 respectively. Specifically, each of the two connecting rod assemblies 12 comprises a first rod 121, a second rod 122, and a third rod 123.

The first rod 121 has a third pivoting point 1213 and a fourth pivoting point 1214. The third pivoting point 1213 is pivotally connected with the second pivoting point 112.

The second rod 122 has a first limiting part 1221, a fifth pivoting point 1225, and a sixth pivoting point 1226. In this and some other embodiments, the first limiting part 1221 is a projection or other suitable limiting structures, but the disclosure is not limited thereto. The fifth pivoting point 1225 is pivotally connected with the first pivoting point 111.

The third rod 123 has a second limiting part 1231, a seventh pivoting point 1237, and a eighth pivoting point 1238. In this and some other embodiments, the second limiting part 1231 is a limiting surface or other suitable limiting structures, but the disclosure is not limited thereto. The seventh pivoting point 1237 is pivotally connected with the sixth pivoting point 1226. The eighth pivoting point 1238 is pivotally connected with the fourth pivoting point 1214.

The elastic buckling arms 13 are located on the first rod 121. In this embodiment, the quantity of the elastic buckling arms 13 of each first rod 121 is two, but the disclosure is not limited thereto. Specifically, each elastic buckling arm has a fixed end 131 and a free end 132. The fixed end 131 is connected to the first rod 121. The free end 132 is kept away from the elastic buckling arm 13 at a distance. Furthermore, the free ends 132 of two elastic buckling arms 13 on the same first rod 121 are mutually opposite (that is, the free ends 132 of two elastic buckling arms 13 face towards opposite directions), but the relative positions of two elastic buckling arms 13 on the first rod 121 are not intended to limit the disclosure.

Two opposite ends of the handle 14 are connected to two one ends, away from the second rod 122, of two third rods 123 respectively. Moreover, the eighth pivoting point 1238 is located between the seventh pivoting point 1237 and the handle 14. Since two opposite ends of the handle 14 are respectively connected to two third rods 123, two connecting rod assemblies 12 are configured for driving the elastic buckling arms 13 simultaneously to move between a release position (as shown in FIG. 3) and a fastening position (as shown in FIG. 2A). Furthermore, when two connecting rod assemblies 12 drive the elastic buckling arms 13 to move counterclockwise from the release position (as shown in FIG. 3) to the fastening position (as shown in FIG. 2A), the first limiting part 1221 of each second rod 122 supports the second limiting part 1231 (as shown in FIG. 2B) of the corresponding third rod 123, to limit the connecting rod assemblies 12 from rotating. Thereby, the elastic buckling arms 13 is configured for being held at the fastening position.

Additionally, in this embodiment, the distance L2 from the third pivoting point 1213 to the fourth pivoting point 1214 is greater than the distance L4 from the seventh pivoting point 1237 to the eighth pivoting point 1238. The distance L4 from the seventh pivoting point 1237 to the eighth pivoting point 1238 is greater than the distance L3 from the fifth pivoting point 1225 to the sixth pivoting point 1226. The distance L3 is greater than the distance L1 from the first pivoting point 111 to the second pivoting point 112. Furthermore, L2 is greater than the sum of L3 and L4. In this and some other embodiments, the relations among L1, L2, L3, and L4 are not used for limiting the disclosure, and can be adjusted by persons skilled in the art when required.

The elastic buckling arms 13 mentioned above are configured for being against the objects to be fixed on the fixing bracket 10. The practical application examples of using fixing bracket 10 to fix objects will be described in following text.

Figure 4:
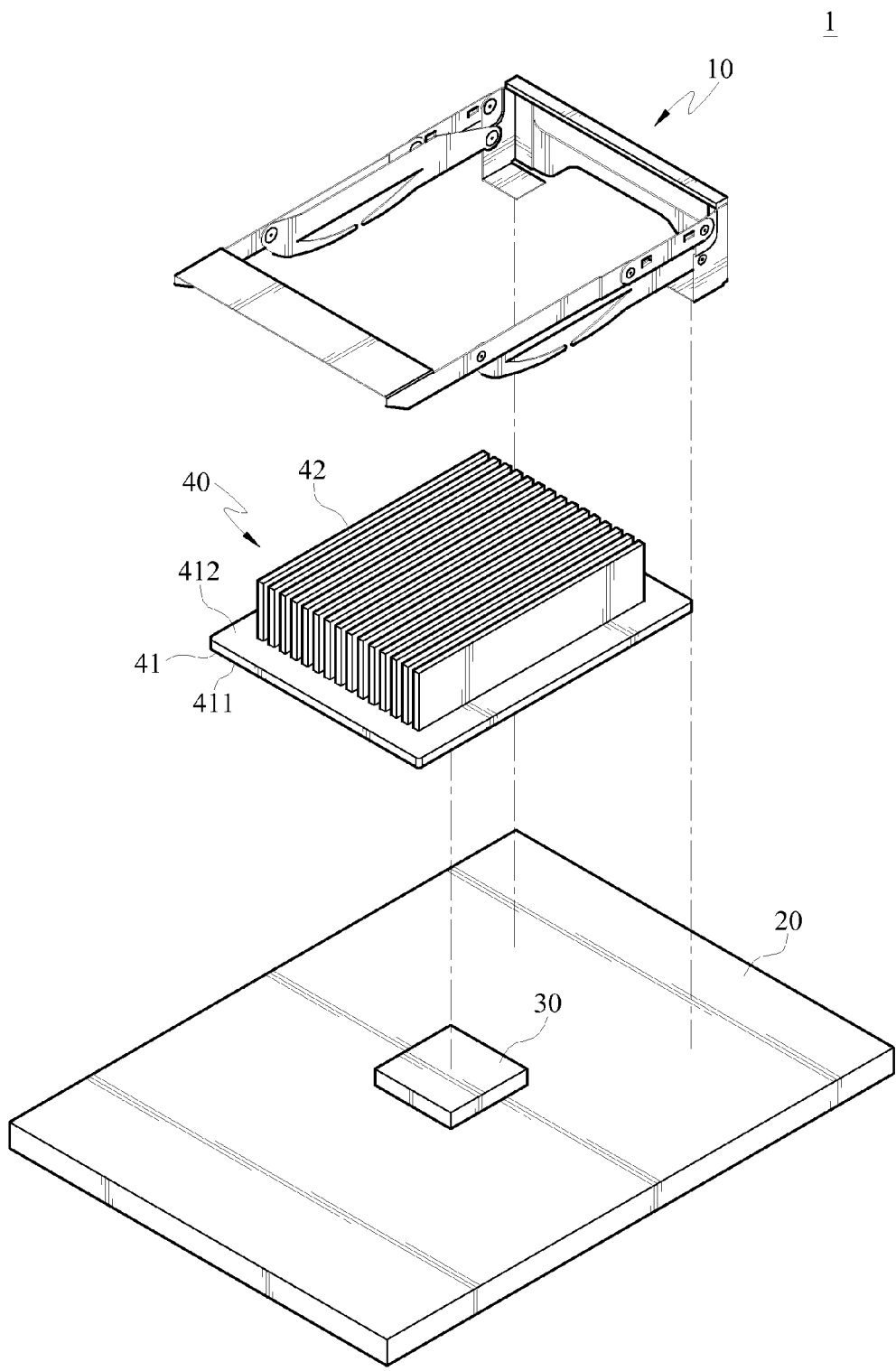
FIG. 4 is an exploded view for the electronic device according to one embodiment of the disclosure.
Figure 5:
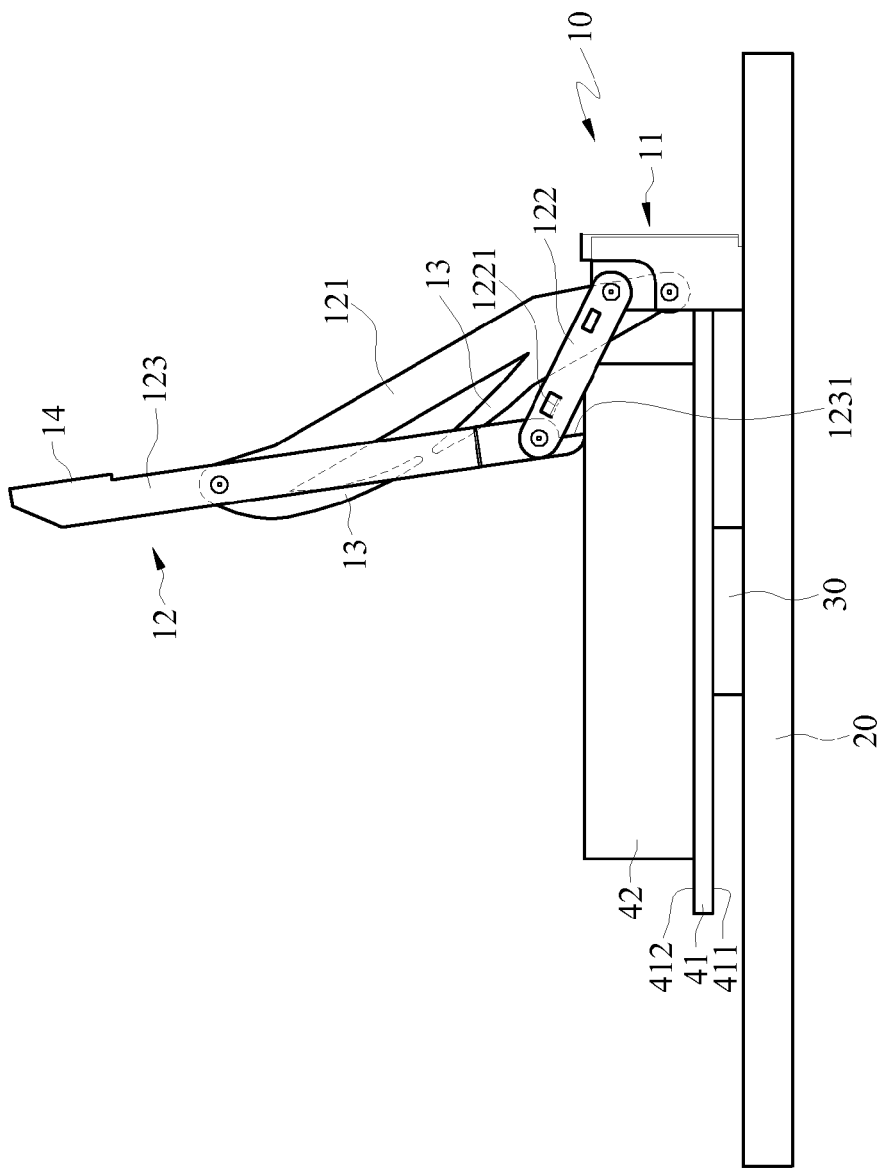
FIG. 5 is a side view for the electronic device, when the fixing bracket is released, according to one embodiment of the disclosure.
Figure 6:
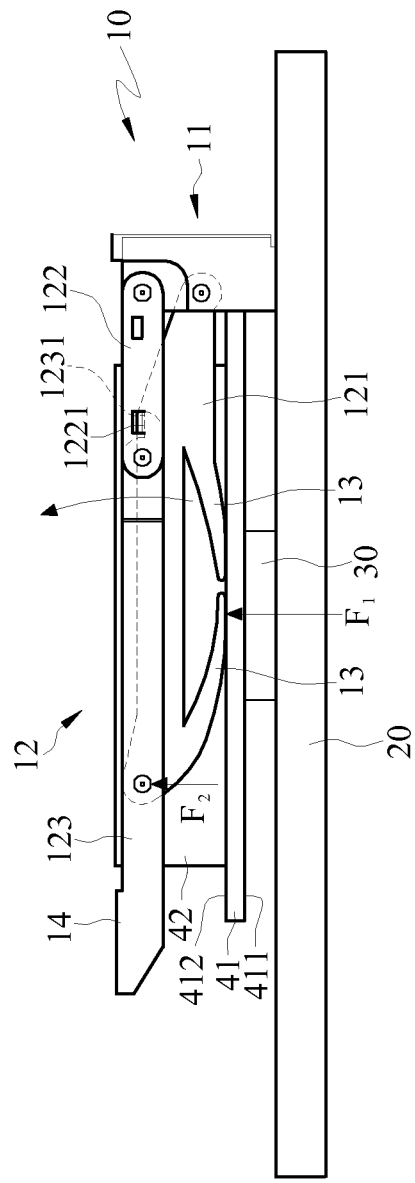
FIG. 6 is a side view for the electronic device, when the fixing bracket is fastened, according to one embodiment of the disclosure.

Please refer to FIG. 4 to FIG. 6. FIG. 4 is an exploded view for the electronic device according to one embodiment of the disclosure. FIG. 5 is a side view for the electronic device, when the fixing bracket being released, according to one embodiment of the disclosure. FIG. 6 is a side view for the electronic device, when the fixing bracket being fastened, according to one embodiment of the disclosure.

The above-mentioned fixing bracket 10 is configured for being operated in an electronic device 1. In this embodiment, the electronic device 1 is a server host or desktop computer, but the disclosure is not limited thereto.

The electronic device 1 comprises a base plate 20, a heat source 30, a radiator 40 and the fixing bracket 10 described in above embodiments.

In this embodiment, the base plate 20 is a motherboard. The heat source 30 is located and on the base plate 20. In this embodiment, the heat source 30 is an operating chip, but not limited thereto.

The radiator 40 comprises a base 41 and a fin group 42 standing on the base 41. The bottom surface 411 for the base 41 of the radiator 40 is overlapped on the heat source 30, to cause a thermal contact between the radiator 40 and the heat source 30.

The bracket body 11 of the fixing bracket 10 is fixed on the base plate 20, and located at one side of the radiator 40.

As shown in FIG. 5 and FIG. 6, to fix the radiator 40 to the base plate 20, a force is needed to be exerted only to the handle 14 so as to drive the elastic buckling arms 13 to move from the release position (as shown in FIG. 5) to the fastening position (as shown in FIG. 6). Thereby, the elastic buckling arms 13 is against the top surface 412 of the base 41 of the radiator 40. Moreover, when the elastic buckling arms 13 is against the top surface 412 of the base, the top surface 412 exert a reaction force F1 to the elastic buckling arms 13. Action of the force F1 causes that the first rod 121 exerts a reaction force F2 to the third rod 123. The arrangement relation for the first rod 121 and the second rod 122 relative to the third rod 123 causes the third rod 123 tend to rotate counterclockwise when affected by the reaction force F2. Although the rod 123 has such trend, the first limiting part 1221 is against the second limiting part 1231 to limit the third rod 123 from rotating, thereby realizing a state of static equilibrium for the first rod 121, the second rod 122 and the third rod 123. In this way, the elastic buckling arms 13 is configured for being kept at the fastening position to firmly fix the radiator 40.

Furthermore, in this embodiment, a simplified structure design of connecting rod assembly 12 is used for enabling the elastic buckling arms 13 to support the radiator 40 at the fastening position, thereby achieving a self-locking state due to the reaction force. Therefore, the fixing bracket 10 of this embodiment needs only one bracket body 11, without the need of two bracket bodies in conventional technology. As a result, the electronic device 1 using the fixing bracket 10 is able to improve the area utilization rate of base plate 20 (motherboard) and reduce the material costs of fixing bracket 10.

According to the fixing bracket and the electronic device using the same, the fixing bracket utilizes a design of connecting rod structure configured for achieving a state of static equilibrium and thus has a self-locking function when the elastic buckling arm is fastened to the fastening position and then suffers a reaction force. Thereby, the quantity of fixing brackets to be used can be reduced. Thus, the utilization rate of motherboard area is improved and the materials costs of the fixing bracket are lowered.

What is claimed is:

1. A fixing bracket, comprising:
   a bracket body, one side of the bracket body having a first pivoting point and a second pivoting point;
   at least one connecting rod assembly, comprising:
      a first rod having a third pivoting point and a fourth pivoting point, the third pivoting point being pivotally connected with the second pivoting point;
      a second rod having a first limiting part, a fifth pivoting point, and a sixth pivoting point, the fifth pivoting point being pivotally connected with the first pivoting point; and
      a third rod having a second limiting part, a seventh pivoting point, and a eighth pivoting point, the seventh pivoting point being pivotally connected with the sixth pivoting point, the eighth pivoting point being pivotally connected with the fourth pivoting point; and
   at least one elastic buckling arm located on the first rod, the connecting rod assembly driving the elastic buckling arm to move between a release position and a fastening position, wherein when the elastic buckling arm is located at the fastening position, the first limiting part is against the second limiting part.

2. The fixing bracket according to claim 1, further comprising another connecting rod assembly, wherein two opposite sides of the bracket body both have a first pivoting point and a second pivoting point, and the two connecting rod assemblies are respectively pivotally connected with the first and second pivoting points, and the first and second pivoting points are located at two opposite two sides of the bracket body respectively.

3. The fixing bracket according to claim 1, further comprising a handle connected to one end of the third connecting rod away from the second rod.

4. The fixing bracket according to claim 1, wherein the distance from the third pivoting point to the fourth pivoting point is greater than the distance from the seventh pivoting point to the eighth pivoting point, the distance from the seventh pivoting point to the eighth pivoting point is greater than the distance from the fifth pivoting point to the sixth pivoting point, and the distance from the fifth pivoting point to the sixth pivoting point is greater than the distance from the first pivoting point to the second pivoting point.

5. The fixing bracket according to claim 1, wherein the first limiting part is a projection and the second limiting part is a limiting surface.

6. An electronic device, comprising:
   a base plate;
   a heat source located on the base plate;
   a radiator in thermal contact with the heat source; and
   a fixing bracket located on the base plate, the fixing bracket comprising:
      a bracket body, one side of the bracket body having a first pivoting point and a second pivoting point;
      at least one connecting rod assembly, comprising
         a first rod having a third pivoting point and a fourth pivoting point, the third pivoting point being pivotally connected to the second pivoting point;
         a second rod having a first limiting part, a fifth pivoting point and a sixth pivoting point, the fifth pivoting point being pivotally connected with the first pivoting point; and
         a third rod having a second limiting part, a seventh pivoting point and a eighth pivoting point, the seventh pivoting point being pivotally connected with the sixth pivoting point, the eighth pivoting point being pivotally connected with the fourth pivoting point; and
      at least one elastic buckling arm located on the first rod, the connecting rod assembly driving the elastic buckling arm to move between a release position keeping a distance away from the radiator and a fastening position being against the radiator, wherein when the elastic buckling arm is located at the fastening position, the first limiting part is against the second limiting part.

7. The electronic device according to claim 6, wherein the fixing bracket further comprises another connecting rod assembly, two opposite sides of the bracket body both have a first pivoting point and a second pivoting point, two connecting rod assemblies are respectively pivotally connected with the first pivoting point and the second pivoting points, and the first pivoting point and the second pivoting points are located at two opposite two sides of the bracket body.

8. The electronic device according to claim 6, wherein the fixing bracket further comprises a handle connected to one end of the third connecting rod away from the second rod.

9. The electronic device according to claim 6, wherein the distance from the third pivoting point to the fourth pivoting point is greater than the distance from the seventh pivoting point to the eighth pivoting point, the distance from the seventh pivoting point to the eighth pivoting point is greater than the distance from the fifth pivoting point to the sixth pivoting point, and the distance from the fifth pivoting point to the sixth pivoting point is greater than the distance from the first pivoting point to the second pivoting point.

10. The electronic device according to claim 6, wherein the radiator comprises a base as well as a fin group located on the base, wherein when the elastic buckling arm is fastened on the fastening position, the elastic buckling arm is against the base of the radiator.

* * * * *